United States Patent [19]

Boston

[11] 4,330,605

[45] May 18, 1982

[54] PHOTOLITHOGRAPHIC RECEPTOR SHEET

[75] Inventor: David R. Boston, Woodbury, Minn.

[73] Assignee: Minnesota Mining and Manufacturing Company, Saint Paul, Minn.

[21] Appl. No.: 226,617

[22] Filed: Jan. 21, 1981

[51] Int. Cl.³ .......................... G03C 5/54; G03F 7/02
[52] U.S. Cl. ..................................... 430/14; 430/204; 430/302
[58] Field of Search ................. 430/14, 204, 205, 302, 430/950, 954

[56] References Cited

U.S. PATENT DOCUMENTS 3,736,872  6/1973  Martens et al. .................... 430/204
3,971,660  7/1976  Staehle ............................... 430/204
4,204,868  5/1980  Boston ............................... 430/204

FOREIGN PATENT DOCUMENTS 1419511  12/1975  United Kingdom ............... 430/204

*Primary Examiner*—Mary F. Downey
*Attorney, Agent, or Firm*—Cruzan Alexander; Donald M. Sell; Gerald F. Chernivec

[57] ABSTRACT

A photolithographic receptor sheet for silver diffusion transfer imaging comprising a support with a hydrophilic layer thereon consisting essentially of colloidal silica and a defined dry hydrophilic powder, and a catalytic silver precipitating nuclei layer thereover. The imaged construction is useful as a lithographic printing plate.

16 Claims, No Drawings

PHOTOLITHOGRAPHIC RECEPTOR SHEET

TECHNICAL FIELD

This invention relates in general to lithographic printing and, more specifically, to a photolithographic image receptor sheet capable of being imaged by utilization of silver salt diffusion transfer principles, the sheet being capable, after imaging, of use as a lithographic printing plate.

BACKGROUND ART

Planographic printing plates typically contain a substrate having a hydrophilic coating thereon, with oleophilic or ink-receptive image areas subsequently being produced directly on the hydrophilic surface. Various light-sensitive materials can be utilized to prepare such image areas, e.g. diazo resins, silver halide emulsions, cinnamic acid esters, etc.

The system having specific utility herein involves the utilization of silver salt diffusion transfer principles. Procedures for preparing photographic images of silver by diffusion transfer principles are generally well-known in the art. Typically, an image-wise exposed silver halide emulsion is contacted with a processing composition containing a developing agent to reduce the exposed silver halide to metallic silver in the emulsion and a silver halide solvent capable of providing a soluble silver complex with the unexposed silver halide. An image-wise distribution of this silver complex is then transferred to a superposed silver-receptive stratum where the silver complex is reduced to metallic silver to impart a silver transfer image to the stratum.

Diffusion transfer has been employed in connection with photolithography by using a hydrophilic material as the silver receptive stratum (to thereby provide the background of a printing plate). The silver image is then used to generate an ink-receptive printing surface on the hydrophilic background. In such a system, the hydrophilic silver-receptive stratum of the receptor sheet typically contains catalytic silver-precipitating nuclei dispersed in a macroscopically continuous vehicle or matrix. One such matrix which has been used is colloidal silica, the silver being deposited image-wise on the silica surface to thus provide the ink-receptive areas of the plate. The deposited silver can be treated, as is taught in U.S. Pat. No. 4,204,868, to render same sufficiently oleophilic to be useful in lithographic printing.

Colloidal silica has conventionally been utilized as the background area, i.e. the hydrophilic area of a printing plate, because silica optimizes the hydrophilicity thereof, most organic materials being less hydrophilic than silica and therefore tending to produce a printing plate which may scum or accept ink in the background areas more readily than those wherein silica is utilized. However, utilizing colloidal silica as the matrix can provide difficulties. First of all, a colloidal silica surface is typically not strong enough to withstand the pressures and abrasive forces exerted by the printing press rollers, thereby limiting the plate in terms of its press life. Secondly, a colloidal silica matrix may not allow sufficient silver deposition on the surface thereof to provide an ink receptive image area capable of extended press runs.

One suggested approach for utilizing silica and yet eliminating or reducing the difficulties mentioned above relates to the concept of using colloidal silica particles of two different sizes, the average particle size of one of the colloidal silicas being about 2.5 times that of the second colloidal silica. Such an improvement provides a tougher hydrophilic silica background capable of extended press runs, and because of the better compaction of the silica using this process, sufficient silver deposition on the silica surface is provided so as to afford a more durable ink-receptive image area.

While the foregoing solved the difficulties encountered with prior art structures, nevertheless, sufficient silver deposition had to be maintained in order to provide proper adhesion of the silver image area to the background, and to provide abrasion resistance to afford extended press life to the plate. With silver costs being what they are today, it would of course be extremely desirable to allow a reduction in the silver requirements without reducing the effectiveness of the resultant plate.

Surprisingly, I have now found that the addition of hereinafter-defined dry particles, such as silica powders, to the above-referenced colloidal silica lattice allows for a significant, i.e., about fifty percent, reduction in silver usage.

In British Pat. No. 1,419,511, there is disclosed a lithographic proofing receiver and lithographic plate which is taught to be manufactured by the use of fumed silica particles, or other inert particles, which have a larger diameter than colloidal silica particles. However, the image-receiving layer therein is formed using polyvinyl alcohol as a binder. Because colloidal silica has a hardening effect on the polyvinyl alcohol, patentees therein include the fumed silica or other inert materials. This is taught to reduce the effect of the colloidal silica on the polyvinyl alcohol. Furthermore, if the structure containing the polyvinyl alcohol is to be utilized on a lithographic press, patentees teach the necessity of the incorporation of the hydrolysis product of tetraethylorthosilicate, or another tetraalkylorthosilicate. The present invention has greater press latitude than the structure of the reference because the polyvinyl alcohol is not utilized herein.

DISCLOSURE OF THE INVENTION

In accordance with the invention, there is provided a photolithographic receptor sheet useful for imaging by a silver diffusion transfer process and comprising a support having coated thereon a hydrophilic layer consisting essentially of colloidal silica and a dry hydrophilic powder, the average particle size of the powder being from about 80 to 400 times the size of the colloidal silica, and being present in the layer at a weight ratio to the colloidal silica of about 0.25 to 1 to about 1.0 to 1, and a layer over the hydrophilic layer comprising a catalytic silver precipitating nuclei material. Preferably, the composite also has an overlayer of a silver halide emulsion.

Also preferably, the colloidal silica in the hydrophilic layer is derived from a mixture of two colloidal silica sols, each of the sols having substantially uniform particle sizes, wherein the average particle size of the first sol is about 2.5 times greater than that of the second sol.

By using such a composite structure, the necessary quantity of deposited metallic silver to provide a printing plate having extended press life can be substantially reduced.

DETAILED DESCRIPTION

Surprisingly, I have ascertained that if I mix together with the colloidal silica sols previously discussed, dry hydrophilic particles which are approximately 80 to 400 times larger than the large sized colloidal particles discussed above, a roughened printing surface is produced which will tend to protect the silver deposit from press abrasion. This, therefore, allows less silver to be required than has been heretofore necessary for lithographic purposes. At the same time, however, the surface area of the plate produced by this technique is sufficiently greater than that produced by the use of colloidal silica alone. This increase in the surface area has necessitated the requirement of a separate coating of catalytic nuclei on the top of the roughened surface so as to provide sufficient catalytic sites per unit of plate surface, to allow efficient deposition of silver.

Particles in a dry hydrophilic matrix of colloidal silica are spheroidal in shape and chemically bonded to one another at points where they touch. It is believed that the lattice formed resembles a densely packed lattice array of spherical particles such as that commonly termed the "cubic close pack". In such an array, a relatively large void is created between the touching particles, the void diameter being about forty percent of the particle diameter in a lattice. In order to reduce the relative porosity of the lattice created by such voids, theoretically, if each void is filled with a particle of an appropriate size, the lattice porosity would be substantially reduced because more particles would be contained per unit volume. In addition, the number of interparticle bonds in the lattice would double, thereby increasing the resistance of the particle lattice to abrasion or crushing. This was accomplished through the use of a colloidal silica sol having a substantially uniform particle size, same being mixed with a second colloidal silica sol, again having a substantially uniform particle size, wherein the average particle size of the first was about 2.5 times that of the second. This provided a silica matrix having excellent effectiveness as a hydrophilic receptor base. By "substantially uniform particle size" is meant that the smallest particles of the first colloidal silica sol are generally at least about 1.5 times larger than the largest particles of the second sol.

Because colloidal silica particles are only spheroidal and not spherical, and the sol particle sizes are only substantially uniform and not absolute, it has been found that a particle ratio of small to large particles of from about 0.5 to 1 to about 4 to 1 will provide the desired benefits, with from about 0.8 to 1 to about 2.0 to 1 being preferred.

I have now determined that by the inclusion of from about 0.25 to 1.0 part of a dry hydrophilic powder per part of colloidal silica solids, same having an average size of from about 80 to about 400 times the larger colloidal silica particle size, a surface is produced which will allow extended press life while reducing the amount of silver necessary to approximately fifty percent that of the prior art. When the size of the hydrophilic dry particles is greater than about 400 times the size of the larger colloidal silica particles, a surface is provided which is excessively rough such that ink may adhere to the excessively roughened hydrophilic surface, thereby creating a less effective printing plate than desired, and the images may have a "grainy" appearance. At a size ratio of less than about 80 to 1, the surface area is decreased such that silver deposits are not effectively protected from press abrasion.

By "dry" hydrophilic powder is meant particles of hydrophilic material, e.g., silica, in the form of a light dry powder having a specified average particle size. This is contrasted with colloidal silica sols, wherein silica particles of specified average size are suspended in an aqueous medium at a specified concentration, by unit weight, of silica solids.

In addition to the dry silica powder, which is preferred, other hydrophilic particles, in the form of dry powders, may also be utilized. Examples include clays such as diatomaceous earth, and various alumina powders, such as aluminum hydroxide (hydrated alumina) and anhydrous alumina.

The hydrophilic coating is produced by conventional coating techniques, such as knife coating, rotogravure, etc. It has been found that the dry coating weight of the hydrophilic layer can typically be in the range of from about 0.05 to about 0.8 grams per square foot. The surface of the coating is matte, as opposed to a normally reflective coating when colloidal silica alone is used. This of course indicates that the coated surface has been roughened, and that the surface area has been significantly increased. Preferred coating weights are in the range of from about 0.1 to about 0.4 grams per square foot. At greater than about 0.8 grams per square foot "mud" cracking can occur, and at less than about 0.05 grams per square foot, the surface may not be sufficiently thick to provide adequate internal layer toughness.

Following application of the hydrophilic layer and drying at about 180° F. for approximately 30 seconds, same is overcoated with a mixture containing colloidal-sized catalytic nuclei for the reduction of silver ions, exemplary materials including conventional metal or metal sulfide particles, which optionally may be contained in a binder matrix. Such particles conventionally act as catalytic sites for the reduction of silver ions during the silver diffusion transfer process, one which is well-known in the art as a method for obtaining a positive image of metallic silver. Other exemplary colloidal catalysts include commercial materials such as Roussel Mild Silver Protein, colloidal silver sulfides, etc. The catalytic nuclei can be applied over the hydrophilic surface by conventional techniques, such as squeeze-roll coating.

Following application of the catalytic nuclei, the structure is normally allowed to cure at room temperature for 2 to 30 days so as to toughen the silica layer.

Following this curing period, typically a non-hardened, light-sensitive silver halide emulsion can be coated thereover, with the weight of silver per unit area in the emulsion coating being significantly less than that capable of being used in prior art structures. For example, the silver weight per unit area can be applied at 0.8 grams per square meter, whereas typically greater than 1.5 grams per square meter has been required in the past to provide sufficient durability for the ultimate printing plate.

Following application of a silver halide emulsion, the resultant structure may be imaged and processed by conventional exposure in an imagewise manner, following which the image may be developed with a diffusion transfer developer, for example, one containing hydroquinone as the developing agent, together with a silver halide solvent, e.g., sodium thiosulfate. The emulsion can then be washed off with a hot water spray, following which the positive metallic silver images can be rendered oleophilic with compositions such as are disclosed in my U.S. Pat. No. 4,204,868. Following this step, the structure can be rinsed with water and dried.

Alternatively, the silver halide emulsion may be on a separate support which can be utilized in conjunction with my receptor sheet and processed by conventional diffusion transfer methods.

As base supports for coatings described above, any conventional lithographic support materials may be utilized, such as silicate-treated aluminum, waterproof paper, and non-deforming plastic films such as polyester. These materials are normally first coated with a mixture of a hydrophilic pigment (e.g., titanium dioxide) and resin to provide a hydrophilic underlayment for the silica coating. The support surface can alternatively be rendered hydrophilic by other conventional means such as gel subbing or corona treatment.

My invention will now be more specifically described by the following non-limiting examples, where all parts are by weight unless otherwise specified.

EXAMPLE 1

A support sheet composed of 4 mil (100 microns) polyethylene terephthalate film was coated on one surface with an 8 micron thick (dry) layer, the layer being applied from a methyl ethyl ketone solution containing 46 percent solids by weight of vinyl chloride-acetate resin ("Vinylite VAGH", commercially available from Union Carbide) and titanium dioxide pigment ("Unitane OR572", commercially available from American Cyanamid) in a ratio of 3 parts titanium dioxde to 1 part by weight vinyl chloride-acetate resin. The pigment was dispersed in the resin solution of methyl ethyl ketone before coating by ball milling for 48 hours. After coating the resulting solution on the support sheet it was dried at 180° F. for 30 seconds. The resultant structure was corona treated, following which a hydrophilic coating of the composition indicated was prepared:

| Water | 217.5 g |
|---|---|
| Nalco 1050 Colloidal Silica, 50 percent solids, average size 20 millimicrons, pH 9.0, from Nalco Chemical | 134.3 g |
| Nalco 1115 Colloidal Silica, 15 percent solids, average size 4 millimicrons, pH 10.4, from Nalco Chemical | 12.2 g |
| Davison Syloid 308 Silica, average size 7 microns, an amorphous dry hydrogel silica from Davison Chemical (pH of 2.5 in 5 percent by weight aqueous slurry) | 35.0 g |
| 1-phenyl-1H-tetrazole-5-thiol, Sodium Salt, (NaPMT) 11 percent by weight solution in H$_2$O | 1.0 g |
| Sodium hydroxide (10 percent by weight aqueous solution) | 3.0 g |

The total solids content of this composition is about 26 percent; the weight ratio of micron-sized dry silica powder to colloidal silica solids is about 0.5:1. The particle size ratio between the dry silica powder and Nalco 1050 colloidal silica is approximately 318:1. The pH of the mixture is approximately 7.5.

The sodium hydroxide was necessary in this particular instance because the Syloid 308 was acidic, and a silica coating composition can thicken or gel if basicity is not maintained.

The silica coating composition was then applied to the substrate with a quadragravure roller having 100 rulings per inch and dried at 180° F. for 30 seconds, resulting in a dry coating weight of approximately 0.2 grams per square foot.

At this point the hydrophilic layer was overcoated with the following mixture:

| Water | 294.8 g |
|---|---|
| Roussel Mild Silver Protein, about 20 wt percent Silver | 5.2 g |
| n-propyl Alcohol | 12.0 g |

The total coating solution contained 0.33 percent by weight silver, and the mixture was squeeze-roll coated over the hydrophilic layer to achieve silver coverage of approximately 0.01 grams per square meter.

Following a room temperature curing period of 5 days, a non-hardened light-sensitive silver chlorobromide emulsion was coated over the catalyst layer, such that the weight of silver per unit area in the emulsion coating was 0.8 grams per square meter. The chloride/bromide ratio was 3:1 in the emulsion, the gelatin to silver ratio was 1.8:1, and the weight of silver was 3 percent of the total wet weight of the coating.

Imaging and further processing was undertaken utilizing a camera/processor, the 3M brand MR-412 Platemaker. The resultant image and developed structure provided a lithographic printing plate. The cameraman's gray scale was open at step 3, and step 4 was inked. The plate was then mounted on an ATF Chief 15 printing press and wiped with an adjuvant solution, following which 4000 high quality copies were produced.

EXAMPLE 2

Example 1 was repeated with the exception that the following hydrophilic coating solution was utilized:

| Water | 211.5 g |
|---|---|
| Nalco 1050 Colloidal Silica | 144 g |
| Nalco 1115 Colloidal Silica | 13.5 g |
| Davison Syloid 244 Silica, an amorphous dry aerogel silica with an average size of 3 to 4 microns, pH 7.6 in 5 percent aqueous slurry, from Davison Chemical | 30 g |
| NaPMT, 11 percent Solution in H$_2$O | 1 g |

The total solids of the solution are about 26%; the weight ratio of micron-sized dry silica powder to colloidal silica was about 0.4:1; and the micron-size:colloidal silica size ratio was about 182:1. The pH of the mixture was about 9.1.

When the plate was further prepared and processed as per example 1, similar results were obtained.

EXAMPLE 3

A plate was prepared as per Example 1, with the exception that the following hydrophilic mixture was utilized:

| Water | 203.8 g |
|---|---|
| Nalco 1050 Colloidal Silica | 155.8 g |
| Nalco 1115 Colloidal Silica | 14.4 g |
| Davison Sylox 27 Silica, an amorphous precipitated silica, average size 2 microns, pH 7.0 of a 5 percent aqueous slurry, from Davison Chemical | 25 g |

| | |
|---|---|
| -continued | |
| NaPMT, 11% Solution in H²O | 1 g |

Total solids content of the coating solution was about 26%; the weight ratio of micron-sized silica powder to colloidal-sized silica was about 0.3:1; and the size ratio of micron-sized silica powder to colloidal-sized silica was about 91:1. The pH of the mixture was about 9.1.

When the plate was further prepared and processed as per Example 1, similar results were obtained.

EXAMPLE 4

The printing plate of Example 1 was prepared with the exception that the catalytic nuclei coating solution was as follows:

| | |
|---|---|
| Water | 348.2 g |
| Difco Proteose Peptone No. 0120-01, a protein digest from Difco Laboratories | 24.4 g |
| 10 percent by wt silver nitrate in water | 21.9 g |
| 10 percent by wt sodium sulfide in water | 25.5 g |

This catalytic nuclei coating mixture contained 0.40 percent by weight silver sulfide. Again, the mixture was squeeze-roll coated over the hydrophilic layer of Example 1 to achieve silver sulfide coverage of about 0.01 grams per square meter.

Following further processing and preparation as per Example 1, similar results were obtained.

When hydrophilic coatings were prepared similar to those described in the Examples, but with micron-sized silica powders either larger, e.g., 9 microns, or smaller, e.g., 1.5 microns, they exhibited reduced functionality as printing plates. In the case of the 9 micron silica powder, "grainy" appearing half-tone images were produced, and ink tended to smear or stick in the crevices of the coating surface when the inked images were rubbed. In the case of the 1.5 micron-sized silica powder, the adhesion of the oleophilic silver images was significantly poorer than when the 2.0 micron-sized silica powder was used.

Similarly, when a plate is prepared utilizing only colloidal silica as the hydrophilic layer, at a silver coverage of 0.8 grams per square meter, reduced capability of the plate surface to adhere silver images thereto was noted. When the colloidal silica plate was coated with a silver halide emulsion at a coverage of 1.6 grams per square meter of silver, the heavier silver deposits obtained provided better image adhesion; in fact, same appeared to be about equivalent to the 0.8 gram per square meter coverage using the plate of my invention.

What is claimed is:

1. A photolithographic receptor sheet capable of being imaged by a silver salt diffusion transfer process, comprising a support having coated thereon a hydrophilic composition consisting essentially of a mixture of colloidal silica and a dry hydrophilic powder, said powder having an average particle size of from about 80 to about 400 times greater than the particle size of said colloidal silica, said powder being present at a weight ratio to said colloidal silica of from about 0.25 to 1 to about 1 to 1; and overlying said hydrophilic layer a coating comprising catalytic silver precipitating nuclei.

2. The sheet of claim 1 further comprising a silver halide emulsion layer over said catalytic silver precipitating nuclei.

3. The sheet of claim 1 wherein said hydrophilic powder is silica.

4. The sheet of claim 1 further comprising an adhesion promoting layer interposed between said support and said hydrophilic layer.

5. A photolithographic receptor sheet capable of being imaged by a silver salt diffusion transfer process comprising a support having coated thereon a hydrophilic layer consisting essentially of colloidal silica derived from mixing first and second colloidal silica sols, each of said sols having substantially uniform particle sizes, and wherein the average particle size of said first sol is about 2.5 times greater than the average particle size of said second sol, and a dry hydrophilic powder, the average particle size of said powder being from about 80 to about 400 times greater than the average particle size of said first colloidal silica sol, said powder being present at a weight ratio to said colloidal silica of from about 0.25 to 1 to about 1.0 to 1, and overlying said hydrophilic layer a coating comprising catalytic silver precipitating nuclei.

6. The sheet of claim 5 further comprising a silver halide emulsion layer over said catalytic silver precipitating nuclei.

7. The sheet of claim 5 wherein the quantities of said sols are such that the ratio of particles of said second sol to said first sol is from about 0.5 to 1 to about 4.0 to 1.

8. The sheet of claim 5 wherein said dry hydrophilic powder is silica.

9. The sheet of claim 5 further comprising an adhesion promoting layer interposed between said support and said hydrophilic layer.

10. A lithographic plate having image areas and background areas comprising a support having coated thereon a hydrophilic layer having silver deposited thereon by means of a diffusion transfer process to thereby form said image areas, said hydrophilic layer consisting essentially of a mixture of colloidal silica and a dry hydrophilic powder, said powder having an average particle size of from about 80 to about 400 times greater than the particle size of said colloidal silica, said powder being present at a weight ratio to said colloidal silica of from about 0.25 to 1 to about 1 to 1.

11. The plate of claim 10 wherein said hydrophilic powder is silica.

12. The plate of claim 10 further comprising an adhesion promoting layer interposed between said support and said hydrophilic layer.

13. A lithographic plate having image areas and background areas comprising a support having coated thereon a hydrophilic layer having a silver deposited thereon by means of a diffusion transfer process to thereby form said image areas, said hydrophilic layer consisting essentially of colloidal silica derived from mixing first and second colloidal silica sols, each of said sols having substantially uniform particle sizes, and wherein the average particle size of said first sol is about 2.5 times greater than the average particle size of said second sol, and a dry hydrophilic powder, the average particle size of said powder being from about 80 to about 400 times greater than the average particle size of said first colloidal silica sol, said powder being present at a weight ratio to said colloidal silica of from about 0.25 to 1 to about 1.0 to 1.

14. The plate of claim 13 wherein the quantities of said sols are such that the ratio of particles of said second sol to said first sol is from about 0.5 to 1 to about 4.0 to 1.

15. The plate of claim 13 wherein said dry hydrophilic powder is silica.

16. The plate of claim 13 further comprising an adhesion promoting layer interposed between said support and said hydrophilic layer.

* * * * *